United States Patent
Polivka

(10) Patent No.: US 8,324,941 B2
(45) Date of Patent: *Dec. 4, 2012

(54) METHOD AND APPARATUS FOR TIME-DIFFERENTIAL COMPARISON OF AN ANALOG SIGNAL

(75) Inventor: William M. Polivka, Campbell, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/409,959

(22) Filed: Mar. 1, 2012

(65) Prior Publication Data

US 2012/0161815 A1    Jun. 28, 2012

Related U.S. Application Data

(63) Continuation of application No. 11/963,645, filed on Dec. 21, 2007, now Pat. No. 8,154,321.

(51) Int. Cl.
*H03D 3/00*    (2006.01)
(52) U.S. Cl. .......... 327/48; 327/39; 327/41; 327/47
(58) Field of Classification Search .......... 327/39–41, 327/43, 46, 47–49
See application file for complete search history.

(56) References Cited

U.S. PATENT DOCUMENTS

| | | | |
|---|---|---|---|
| 3,651,414 A | 3/1972 | Jamieson | |
| 3,737,789 A | 6/1973 | McCoy et al. | |
| 4,114,083 A | 9/1978 | Benham et al. | |
| 4,602,246 A | 7/1986 | Jensen | |
| 8,154,321 B2 * | 4/2012 | Polivka | 327/48 |

OTHER PUBLICATIONS

CN 200810187880.2—First Chinese Office Action, issued Dec. 1, 2011, with English Translation (11 pages).

* cited by examiner

*Primary Examiner* — Lincoln Donovan
*Assistant Examiner* — Shikha Goyal
(74) *Attorney, Agent, or Firm* — Blakely Sokoloff Taylor & Zafman LLP

(57) ABSTRACT

A time-differential analog comparator is disclosed. An example apparatus according to aspects of the present invention includes a source of a variable frequency signal having a frequency responsive to an analog input. A counting circuit is coupled to count cycles of the variable frequency signal. The counting circuit is coupled to count in a first direction for a first time interval and is coupled to count in a second direction opposite to the first direction for a second time interval that occurs after an end of the first time interval. The counting circuit outputs a digital count signal and an evaluation circuit is coupled to generate a decision signal in response to the digital count signal after an end of the second time interval. The first time interval is not equal to the second time interval to generate an offset in the decision signal.

15 Claims, 3 Drawing Sheets

METHOD AND APPARATUS FOR TIME-DIFFERENTIAL COMPARISON OF AN ANALOG SIGNAL

REFERENCE TO PRIOR APPLICATIONS

This application is a continuation of U.S. application Ser. No. 11/963,645, filed Dec. 21, 2007, now pending. U.S. application Ser. No. 11/963,645 is hereby incorporated by reference.

BACKGROUND INFORMATION

1. Field of the Disclosure

The present invention relates generally to analog signals, and more specifically, the invention relates to processing analog signals.

2. Background

Conventional comparators make a comparison between an instantaneous value of an analog signal and a reference. A time-differential analog comparator compares values of an analog signal gathered over a present time interval with values of the same analog signal gathered over a past time interval. It is useful in some applications of electronic circuits to know whether or not a slowly changing quantity has changed significantly over a relatively long period of time for the circuit.

Electronic circuits typically use components that are optimized for operation at high speeds, responding to events that occur in very short times. Those circuits are often used in applications to control slowly varying processes that take much longer times to respond. For example, the components of the miniature circuits that regulate large mechanical systems and to control industrial processes typically are scaled to operate with events that occur over periods of microseconds. Those circuits often must respond to events that occur over periods of several seconds, minutes, or hours. It is not practical to increase the size of the circuit to match the slow response of the application.

A common technique that allows small, fast circuits to work with a slow, analog process converts the analog information into digital form and then stores the digital information in a memory. The fast circuit either waits in a suspended state or performs other tasks until sufficient time passes for a change to be likely in the analog information. Then the present analog information is converted to digital form and compared to the past analog information that has been stored in memory. This technique is natural in larger systems that use analog to digital converters, digital memory, and digital processors in their control circuits. The technique is usually not practical for simple, low-cost systems that do not otherwise require analog-to-digital conversion and digital memory in their control circuits.

An alternative technique that stores the analog information as an analog value with a sample and hold circuit for use with a conventional comparator is also not practical when long intervals of time are involved, particularly when it is desired to package the control function in an integrated circuit, as the use of such alternative techniques generally involves large capacitors and very small currents that approach the values of leakage currents.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Examples related to implementing a time-differential comparison of an analog signal in accordance with the present invention are disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment," "an embodiment," "one example" or "an example" means that a particular feature, structure or characteristic described in connection with the embodiment is included in at least one embodiment or example of the present invention. Thus, the appearances of the phrases "in one embodiment," "in an embodiment," "in one example" or "in an example" in various places throughout this specification are not necessarily all referring to the same embodiment. The particular features, structures or characteristics may be combined for example into any suitable combinations and/or sub-combinations in one or more embodiments or examples. Furthermore, the particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Figure 1:
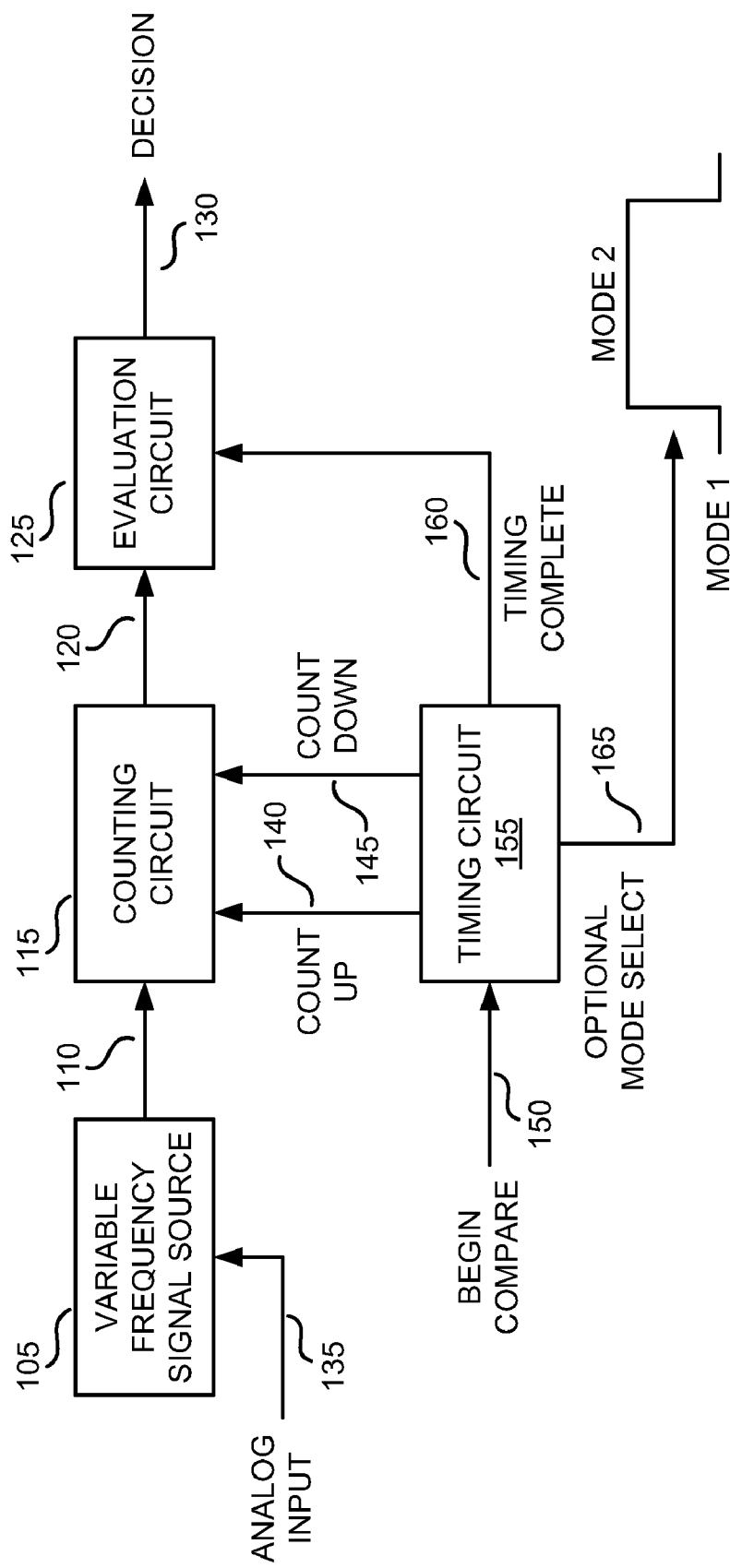
FIG. 1 shows generally one example of a block diagram of an apparatus that implements a time-differential comparison of an analog signal in accordance with the teachings of the present invention.

FIG. 1 shows generally one example of a block diagram of an apparatus that implements a time-differential comparison of an analog signal in accordance with the teachings of the present invention. As shown, a variable frequency signal source 105 is coupled to receive an analog input 135. The analog input 135 may be an electrical signal or an extrinsic parameter such as temperature or altitude. In the example, the frequency response of variable frequency signal source 105 can be linear or nonlinear and the frequency of the signal 110 from the variable frequency signal source 105 can either increase or decrease in response to an increasing value of the analog input 135, as long as it always increases or always decreases when the analog input 135 increases within a range of interest.

The analog signal received from analog input 135 may be an electrical signal or an intrinsic parameter of a component of a circuit. The component may be a component of the variable frequency signal source 105 or a component of a different circuit. In one example, the component of the circuit is included in an integrated circuit. In one example, the intrinsic parameter is the resistance of a temperature-dependent resistor in the variable frequency signal source 105. Thus, in such an example, the intrinsic parameter is responsive to temperature.

In one example, a counting circuit 115 counts cycles of the variable frequency signal source 105. The timing circuit 155 determines when the counting circuit 115 counts, and whether each count increases or decreases the accumulated value of the counting circuit 115. As shown in the example, the timing circuit 155 receives a begin compare 150 command to perform a comparison of the analog signal received at the analog input 135. The timing circuit 155 may optionally provide an optional mode select signal 165, which in one example is a stimulus that functions as a reference for the comparison of the analog signal before the stimulus and after the stimulus. In one example, the stimulus is a change that is likely to affect the value of the analog signal received at the analog input 135. In one example, the stimulus occurs after the timer receives the begin compare 150 command. The stimulus is therefore the time of reference for comparison of the two values of the analog signal, as the value of the analog signal after the stimulus is compared to the value of the analog signal before the stimulus.

A counting circuit 115, which in one example is a bidirectional counter, sometimes referred to as an up-down counter, receives a repeating signal 110 from the variable frequency signal source 105. The counting circuit 115 delivers the value of the count as either a serial or a parallel digital count signal 120 that may include a plurality of digital bits. A count up signal 140 and a count down signal 145 from timing circuit 155 determine how the counting circuit 115 responds to repeating cycles of the signal 110 from the variable frequency signal source 105. The counting circuit 115 may increase the value of the count, decrease the value of the count, or leave the count unchanged for each cycle of the signal 110 from the variable frequency source 105.

As shown in the example, the count up signal 140 and the count down signal 145 are received from timing circuit 155. In one example, timing circuit 155 begins a timing sequence in response to a begin compare signal 150. During the timing sequence, timing circuit 155 may assert a count up signal 140, a count down signal 145, an optional mode select signal 165, and a timing complete signal 160. When the timing sequence is complete, the timing circuit 155 asserts the timing complete signal 160. One example of the timing of these signals will be detailed in FIG. 2 below. In an example in which the optional mode select signal 165 is not provided, the timing circuit 155 is also not included and the count up signal 140, the count down signal 145 and the timing complete signal 160 are provided to the counting circuit 115 and evaluation circuit 125 from an external source.

As shown in the depicted example, an evaluation circuit 125 receives the digital count signal 120 and the timing complete signal 160 to produce a decision signal 130. The decision signal 130 is coupled to produce a desired response to the result of the comparison of the analog input 135 in accordance with the teachings of the present invention. For example if the result of the comparison is undesirable, the decision signal 130 may direct a reversal of the stimulus that produced the change in the analog signal. If the result of the comparison is either desirable or inconsequential, the decision signal 130 may take no action.

Figure 2:
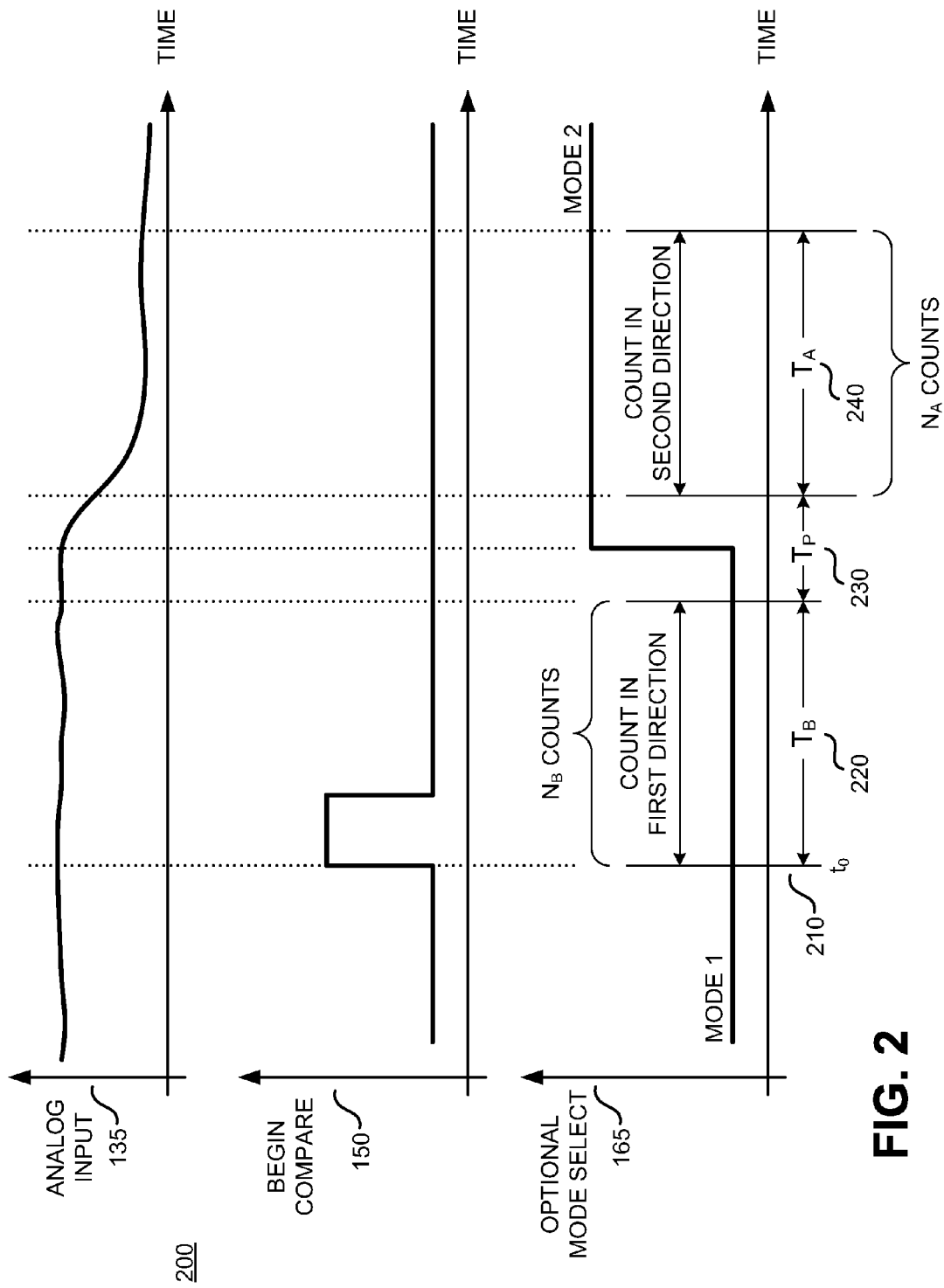
FIG. 2 shows representative waveforms of three signals of an example apparatus that implements a time-differential comparison of an analog signal in accordance with the teachings of the present invention.

FIG. 2 shows representative time relationships 200 of three signals from one example of the time-differential analog comparator shown in FIG. 1 in accordance with the teachings of the present invention. The example illustrated in FIG. 2 shows the optional mode select signal 165 generated by timing circuit 155 being used to change an external parameter between time interval $T_B$ 220 and time interval $T_A$ 240, which stimulates a change in the analog input 135. In the example illustrated in FIG. 2, time interval $T_B$ comes before the change in the analog input 135, and time interval $T_A$ comes after the change in the analog input 135.

In one example, analog input 135 shown FIG. 2 may be an electrical signal representative of a temperature of an electrical circuit such as a switched mode power supply. In another example, analog input 135 may be an indication of the fuel consumption of a motor vehicle. In yet another example, analog input 135 shown in FIG. 2 may represent the concentration of an exhaust gas from the engine of a motor vehicle. In the example directed to the power supply, the optional mode select signal 165 may be used to change a mode of the power supply to improve an efficiency of the power supply. In the examples directed to a motor vehicle, the optional mode select signal 165 may change the gear ratio of the transmission that couples the engine to the wheels of the vehicle. In such examples, the purpose of the comparison may be to determine whether or not a change in gear ratio causes a desirable change in the analog input 135. In such examples, the decision signal 130 could be used to indicate whether it is better to stay at the current gear ratio or to select a different gear ratio. In a simple example, the evaluation circuit 125 merely indicates whether or not the count from the bidirectional counter is greater than zero at the end of timing interval $T_A$ 240. It is appreciated of course that the examples described above are merely examples provided for explanation purposes and that other applications may be employed in accordance with the teachings of the present invention.

Referring back to the example shown in FIG. 2, the begin compare signal 150 is asserted at time $t_0$ 210 to timing circuit 155, which as will be discussed begins a sequence of timing events, while the optional mode select signal 165 at time $t_0$ 210 is in a low state to select a first mode. At time $t_0$ 210, timing circuit 155 starts the counting circuit 115 to count the cycles of the signal 110 in a first direction for the duration of time interval $T_B$ 220. At the end of time interval $T_B$ 220, counting circuit 115 has counted $N_B$ periods of the variable frequency signal source 105, and the timing circuit 155 pauses the counter for the duration of a pause interval $T_P$ 230. The count of the counting circuit 155 does not change during the pause interval $T_P$ 230. During the pause interval $T_P$ 230, the optional mode select signal 165 changes from a low state to a high state that indicates the selection of a second mode.

In the example illustrated in FIG. 2, the analog input 135 responds to the change in mode with a decrease in magnitude. The variable frequency signal source 105 responds to the change in the analog input 135 by changing the frequency of the signal 110. Timing circuit 155 then causes the counting circuit 115 to count the cycles of the signal 110 from variable frequency signal source 105 in the second direction, opposite to the first direction, during time interval $T_A$ 240. At the end of time interval $T_A$ 240, counting circuit 115 has counted $N_A$ cycles of the signal 110 from variable frequency signal source 105, and the resultant digital count 120 is the difference between the counts $N_B$ and $N_A$. Therefore, the resultant digital count 120 at the end of time interval $T_A$ 240 will indicate how the analog input 135 after the pause interval $T_P$ 230 differs from the analog input 135 before the pause interval $T_P$ 230 in accordance with the teachings of the present invention In most examples, time interval $T_B$ 220 before the pause interval $T_P$ 230 is equal to time interval $T_A$ 240 after the pause interval $T_P$ 230, although $T_B$ 220 can differ from $T_A$ 240 to achieve a desired offset in the result. The pause interval $T_P$ 230 is typically long enough for the mode to change and for parameters to stabilize. In some examples, the pause interval $T_P$ 230 may be the time necessary only for the counting circuit 115 to change direction. Therefore, in some examples, the pause interval $T_P$ 230 may be substantially zero. In other examples, the pause interval $T_P$ 230 may be substantially longer than time interval $T_A$ 240 and time interval $T_B$ 220. In other examples, the pause interval $T_P$ may be achieved by temporarily stopping the variable frequency signal source 105 instead of inhibiting the counting circuit 115.

In one example, timing circuit 155 may be a digital interval counter that is responsive to timing information from an oscillator that has a substantially fixed frequency. In another example, timing circuit 155 may be an analog timer, such as one that charges and discharges a capacitor to reach voltage thresholds within desired intervals of time.

Figure 3:
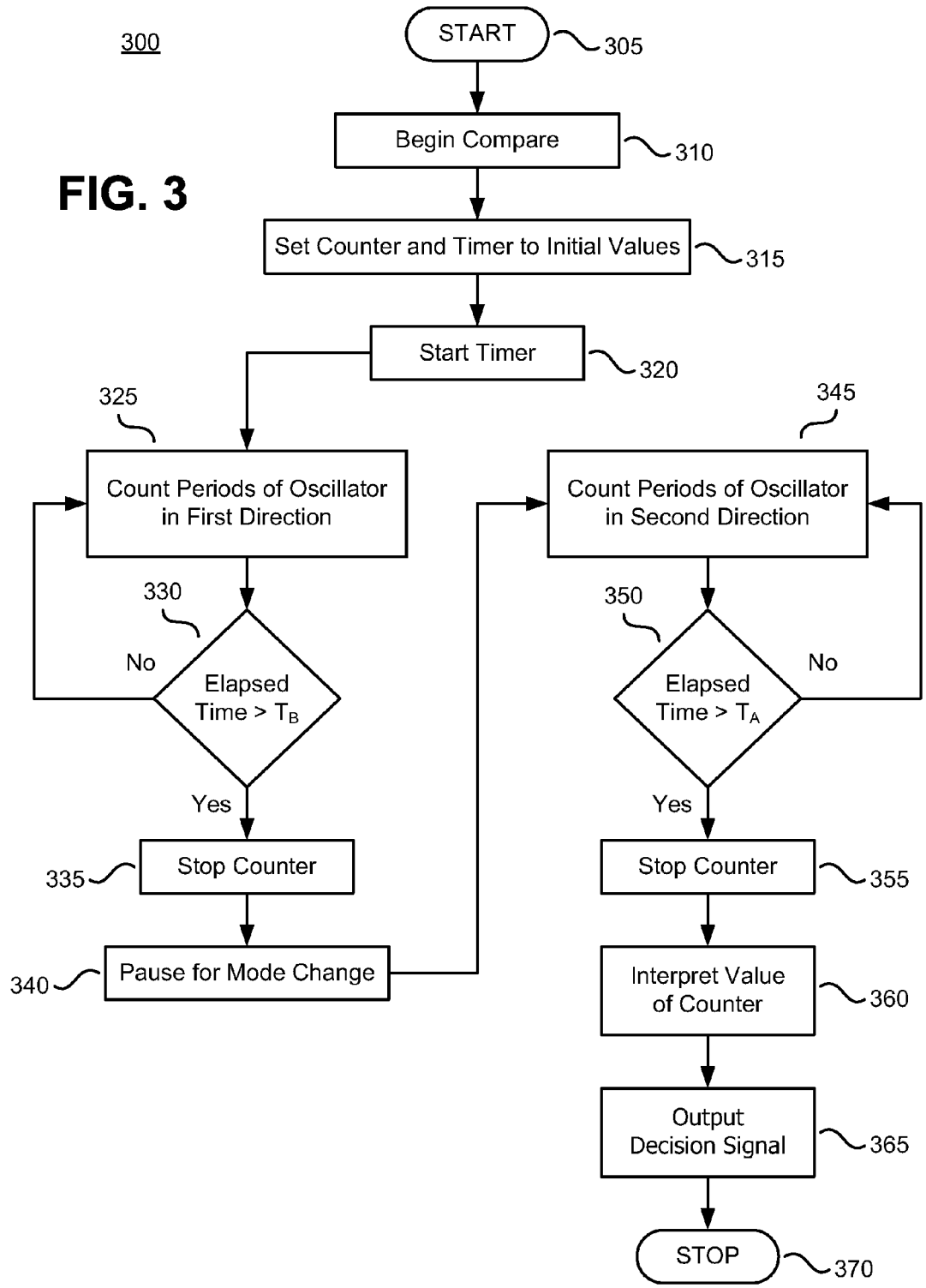
FIG. 3 shows a flow diagram that illustrates an example method of performing a time-differential comparison of an analog signal in accordance with the teachings of the present invention.

FIG. 3 is a flow diagram 300 that illustrates an example method for a time-differential comparison of an analog signal that uses the elements in the example shown FIG. 1 in accordance with the teachings of the present invention. In the flow diagram 300 of FIG. 3, the counting circuit 115 is referred to as a counter, the timing circuit 155 is referred to as a timer, and the variable frequency signal source 105 is referred to as an oscillator. As shown in the example, the process of comparison starts in block 305. Block 310 asserts a begin compare signal 150 to begin the sequence for the comparison. A counting circuit 115 and a timing circuit 155 are set to initial values in block 315. The timing circuit 155 starts timing in block 320. The counting circuit 115 counts cycles of the repeating signal 110 from variable frequency signal source 105 in a first direction in block 325, updating the count after every counted period. Block 330 checks the elapsed time of the timing circuit 155 from its start in block 320. The counting circuit 115 continues to count cycles of the repeating signal 110 from the variable frequency signal source 105 for duration $T_B$ 220. Then the counting circuit 115 stops in block 335.

In one example, the timing circuit 155 stops the counting circuit 115 at block 335 while the variable frequency signal source 105 continues to oscillate. In another example, the timing circuit 155 stops the variable frequency signal source 105 to stop the counting circuit 115 from counting. After a pause, during which the mode may optionally be changed in block 340 with optional mode select signal 165, the counting circuit 115 counts the cycles of the variable frequency signal source 105 in the second direction in block 345, the second direction being opposite to the first direction. In another example, the mode is not optionally changed during the pause in block 340 and the count in the second direction is performed after the pause. In either example, if the first direction increments the counting circuit 115 on each count, counting up, then the second direction decrements the counting circuit 115, counting down, from the number $N_B$ that the counting circuit 155 accumulated at the end of time interval $T_B$ 220. Block 350 checks the elapsed time of the timing circuit 155 from the end of the pause in block 340. The counting circuit 115 continues to count cycles of the signal 110 from the variable frequency signal source 105 for duration $T_A$ 240. Then counting circuit 110 stops counting in block 355. The evaluation circuit 125 interprets the value of the count in block 360 to produce the decision signal 130 in block 365. The process ends at block 370.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A time-differential analog comparator, comprising:
    a variable frequency signal source coupled to provide a repeating signal having a plurality of periods, wherein each period has a frequency corresponding to a value of an analog input;
    a counting circuit coupled to count the periods of the repeating signal, wherein the counting circuit is coupled to count in a first direction for a first time interval and coupled to count in a second direction opposite to the first direction for a second time interval that occurs after an end of the first time interval, wherein the counting circuit outputs a digital count signal; and
    an evaluation circuit coupled to the counting circuit to generate a decision signal in response to a count of the periods of the repeating signal indicated by the digital count signal after an end of the second time interval, wherein the first time interval is not equal to the second time interval to generate an offset in the decision signal.

2. The time-differential analog comparator of claim 1, wherein the analog input is an electrical signal.

3. The time-differential analog comparator of claim 1, wherein the analog input is an intrinsic parameter of a component of a circuit.

4. The time-differential analog comparator of claim 3, wherein the component of the circuit is included in an integrated circuit.

5. The time-differential analog comparator of claim 3, wherein the intrinsic parameter is responsive to temperature.

6. The time-differential analog comparator of claim 1, further comprising a timing circuit coupled to the counting circuit and the evaluation circuit, wherein the first time interval and the second time interval are determined by the timing circuit, and wherein the timing circuit is further coupled to generate a mode select signal at a time between the first time interval and the second time interval to stimulate a change in the analog input.

7. The time-differential analog comparator of claim 6, wherein the timing circuit is responsive to an input that begins a sequence of timing events that includes the first time interval and the second time interval.

8. The time-differential analog comparator of claim 7, wherein the sequence of timing events includes a pause interval between the first time interval and the second time interval.

9. The time-differential analog comparator of claim 6, wherein the timing circuit is coupled to generate a signal to change an external parameter between the first time interval and the second time interval.

10. The time-differential analog comparator of claim 1, wherein the counting circuit is to be coupled to receive a count up signal and a count down signal from a source external to the time-differential analog comparator to control the direction of counting by the counting circuit.

11. A method of performing a time-differential comparison of an analog signal, comprising:

generating a repeating signal having a plurality of periods, wherein each period has a frequency corresponding to a value of the analog signal;

counting in a first direction during a first time interval in response to the periods of the repeating signal;

counting in a second direction during a second time interval in response to the periods of the repeating signal;

generating a digital count signal representative of the count of periods after the second time interval; and generating a decision signal in response to the digital count signal, wherein the first time interval is not equal to the second time interval to generate an offset in the decision signal.

12. The method of claim 11, further comprising changing an external parameter between an end of the first time interval and before a beginning of the second time interval.

13. The method of claim 11, further comprising generating a mode select signal at a time between the first time interval and the second time interval to stimulate a change in the analog signal.

14. The method of claim 11, further comprising initializing the count of the periods of the repeating signal before a beginning of the first time interval.

15. The method of claim 11, further comprising outputting a decision signal in response to the evaluation of the count of the periods of the repeating signal after the end of the second time interval.

* * * * *